US011348900B2

(12) United States Patent
Lin et al.

(10) Patent No.: US 11,348,900 B2
(45) Date of Patent: *May 31, 2022

(54) PACKAGE STRUCTURE

(71) Applicant: MediaTek Inc., Hsin-Chu (TW)

(72) Inventors: Tzu-Hung Lin, Hsin-Chu (TW); Yu-Hua Huang, Hsinchu (TW); Wei-Che Huang, Zhudong Township, Hsinchu County (TW); Ming-Tzong Yang, Baoshan Township (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/899,335

(22) Filed: Jun. 11, 2020

(65) Prior Publication Data

US 2020/0303352 A1    Sep. 24, 2020

Related U.S. Application Data

(63) Continuation of application No. 15/347,803, filed on Nov. 10, 2016, now Pat. No. 10,727,202, which is a (Continued)

(51) Int. Cl.
| | | |
|---|---|---|
| *H01L 25/065* | (2006.01) | |
| *H01L 23/00* | (2006.01) | |
| *H01L 25/18* | (2006.01) | |

(52) U.S. Cl.
CPC .......... *H01L 25/0657* (2013.01); *H01L 24/16* (2013.01); *H01L 24/32* (2013.01);
(Continued)

(58) Field of Classification Search
CPC ................. H01L 25/0657; H01L 25/18; H01L 2224/16145; H01L 2224/32014;
(Continued)

(56) References Cited

U.S. PATENT DOCUMENTS 7,859,098 B2 *  12/2010  Ong ........................ H01L 24/19
                                                              257/698
9,524,948 B2   12/2016  Lin et al.
(Continued)

FOREIGN PATENT DOCUMENTS

| CN | 139278 A | 1/2003 |
|---|---|---|
| CN | 1649149 A | 8/2005 |

(Continued)

*Primary Examiner* — Timor Karimy
(74) *Attorney, Agent, or Firm* — Wolf, Greenfield & Sacks, P.C.

(57) ABSTRACT

A package structure comprising: a substrate, having at least one conductive units provided at a first surface of the substrate; at least one first die, provided on a second surface of the substrate; a connecting layer, provided on the first die; a second die, provided on the connecting layer, wherein the connecting layer comprises at least one bump for connecting the first die; and at least one bonding wire. The connecting layer has a first touch side and a second touch side, the first touch side contacts a first surface of the first die and the second touch side contacts a second surface of the second die, an area of the first touch side is smaller than which for the first surface of the first die, and a size of the first die equals to which of the second die.

17 Claims, 8 Drawing Sheets

Related U.S. Application Data continuation of application No. 14/040,732, filed on Sep. 30, 2013, now Pat. No. 9,524,948.

(52) U.S. Cl.
CPC .............. *H01L 24/48* (2013.01); *H01L 24/73* (2013.01); *H01L 25/18* (2013.01); *H01L 2224/16145* (2013.01); *H01L 2224/32014* (2013.01); *H01L 2224/32058* (2013.01); *H01L 2224/32105* (2013.01); *H01L 2224/32145* (2013.01); *H01L 2224/48227* (2013.01); *H01L 2224/73204* (2013.01); *H01L 2224/73207* (2013.01); *H01L 2224/73215* (2013.01); *H01L 2225/0651* (2013.01); *H01L 2225/06513* (2013.01); *H01L 2225/06562* (2013.01); *H01L 2225/06565* (2013.01); *H01L 2225/06568* (2013.01); *H01L 2924/00014* (2013.01); *H01L 2924/1431* (2013.01); *H01L 2924/1434* (2013.01); *H01L 2924/15311* (2013.01)

(58) Field of Classification Search
CPC . H01L 2224/32058; H01L 2224/32105; H01L 2224/32145; H01L 2224/48227; H01L 2224/73204; H01L 2224/73207; H01L 2224/73215; H01L 2225/0651; H01L 2225/06513; H01L 2225/06562; H01L 2225/06565; H01L 2225/06568; H01L 2924/00014; H01L 2924/1431; H01L 2924/1434; H01L 2924/15311

See application file for complete search history.

(56) References Cited

U.S. PATENT DOCUMENTS

| | | |
|---|---|---|
| 2003/0110625 A1 | 6/2003 | Fang |
| 2004/0251531 A1 | 12/2004 | Yang et al. |
| 2005/0170600 A1 | 8/2005 | Fukuzo |
| 2006/0244117 A1* | 11/2006 | Karnezos ................ H01L 25/03 |
| | | 257/678 |
| 2007/0057357 A1 | 3/2007 | Chen |
| 2007/0170575 A1* | 7/2007 | Lee ........................ H01L 23/66 |
| | | 257/686 |
| 2007/0228543 A1 | 10/2007 | Walter et al. |
| 2011/0180913 A1* | 7/2011 | Liou ...................... H01L 24/81 |
| | | 257/666 |
| 2012/0187560 A1 | 7/2012 | Choi et al. |
| 2012/0276691 A1 | 11/2012 | Camacho et al. |
| 2013/0147025 A1 | 6/2013 | Liou et al. |
| 2013/0161788 A1 | 6/2013 | Chun et al. |
| 2014/0042600 A1 | 2/2014 | Kim et al. |
| 2015/0091158 A1 | 4/2015 | Lin et al. |
| 2017/0062388 A1 | 3/2017 | Lin et al. |

FOREIGN PATENT DOCUMENTS

| | | |
|---|---|---|
| CN | 102136434 A | 7/2011 |
| CN | 103178054 A | 6/2013 |
| JP | 2007-207805 A | 8/2007 |
| WO | WO 2013/105153 A1 | 7/2013 |

* cited by examiner

PACKAGE STRUCTURE

CROSS REFERENCE TO RELATED APPLICATION

This Application is a Continuation of U.S. application Ser. No. 15/347,803, filed Nov. 10, 2016, which is a Continuation of U.S. application Ser. No. 14/040,732, filed Sep. 30, 2013. The entire contents of these applications are incorporated herein by reference in their entirety.

BACKGROUND

A wide I/O memory device is a memory device having pins more than other kinds of memory devices. The wide I/O memory device can have a rapid data accessing speed, since it has large number of pins to access data.

FIG. 1 is a cross sectional diagram illustrating a semiconductor structure for a related art wide I/O memory device. As shown in FIG. 1, the wide I/O memory device 100 has a memory cube MC and a logic die LI provided on a substrate Su. The memory cube MC comprises a plurality of memory dies MI. Vias VA (only one is marked by the symbol) are generated via a TSV (Through-Silicon Via) process, such that the memory cube MC and a logic die LI can be electrically connected to the conductive units Cu (ex. solder ball) or the substrate Su. However, the I/O memory device needs plenty of vias since it has many pins, but the TSV process causes high cost. Therefore, the cost for the I/O memory device is extremely high.

SUMMARY

Therefore, one objective of the present application is to provide a package structure that can be generated without the TSV process.

One embodiment of the present application provides a package structure, which comprises: a substrate, having at least one conductive units provided at a first surface of the substrate; at least one first die, provided on a second surface of the substrate; a connecting layer, provided on the first die; a second die, provided on the connecting layer, wherein the connecting layer comprises at least one bump for connecting the first die to the second die such that the first die and the second die are electrically connected; and at least one bonding wire, for electrically connecting the first die to the conductive units or the substrate. The connecting layer has a first touch side and a second touch side, the first touch side contacts a first surface of the first die and the second touch side contacts a second surface of the second die, an area of the first touch side is smaller than which for the first surface of the first die, and a size of the first die equals to which of the second die.

Another embodiment of the present application provides a package structure, which comprises: a substrate, having at least one conductive units provided at a first surface of the substrate; at least one first die, provided on a second surface of the substrate; a connecting layer, provided on the first die; a second die, provided on the connecting layer, wherein the connecting layer comprises at least one bump for connecting the first die to the second die such that the first die and the second die are electrically connected; and at least one bonding wire, for electrically connecting the first die to the conductive units or the substrate. A location for the first die or the second die is shifted.

In view of above-mentioned embodiments, a package structure can be produced without performing TSV processes. Therefore, the cost can be largely reduced.

These and other objectives of the present invention will no doubt become obvious to those of ordinary skill in the art after reading the following detailed description of the preferred embodiment that is illustrated in the various figures and drawings.

DETAILED DESCRIPTION

The package structure according to the present application will be explained for detail below. Please note the package structure according to the present application is not only can be applied to the above-mentioned wide I/O memory device, but also can be applied to other electronic devices.

Figure 1:
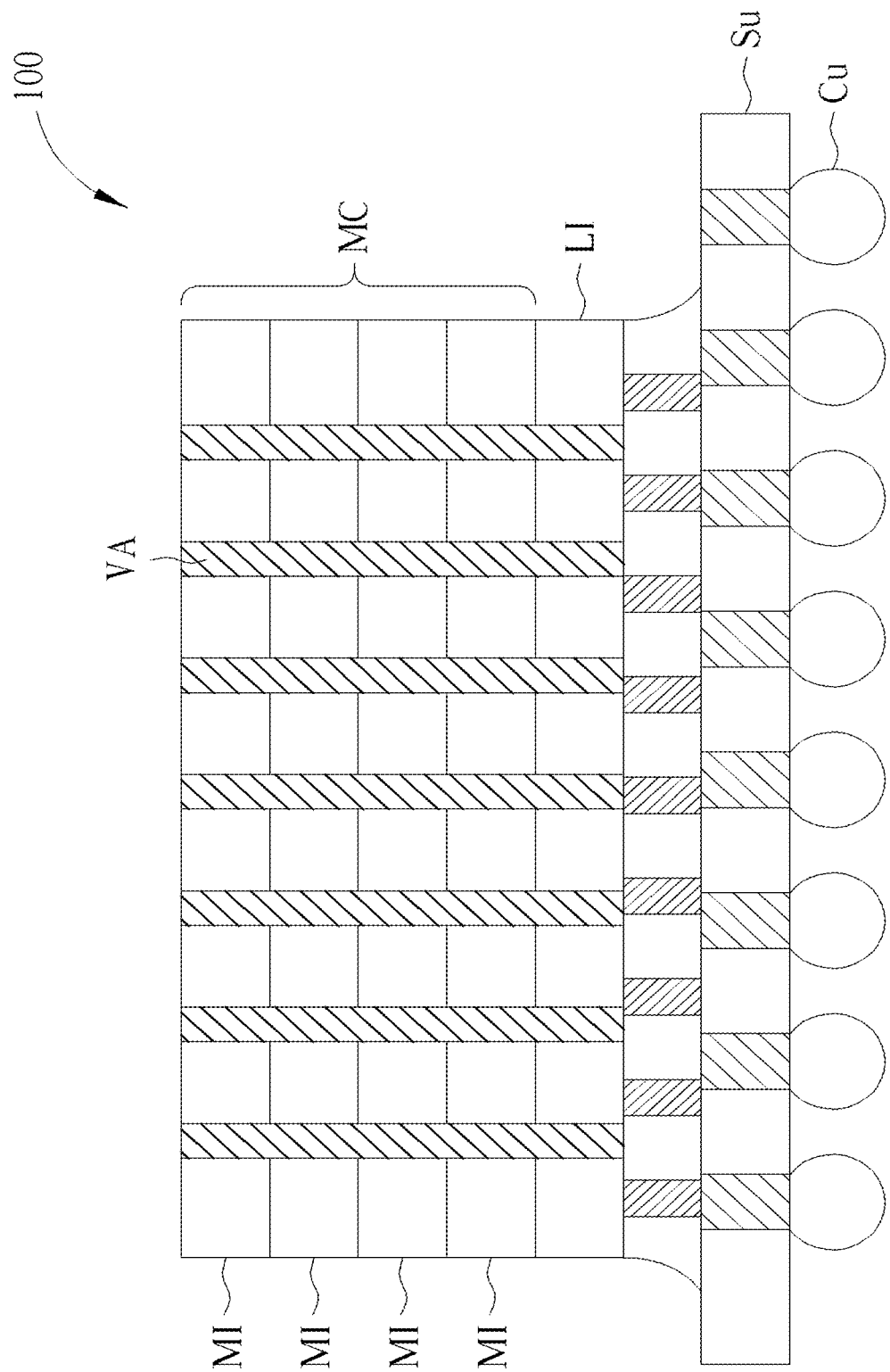
FIG. 1 is a cross sectional diagram illustrating a semiconductor structure for a related art wide I/O memory device.
Figure 2:
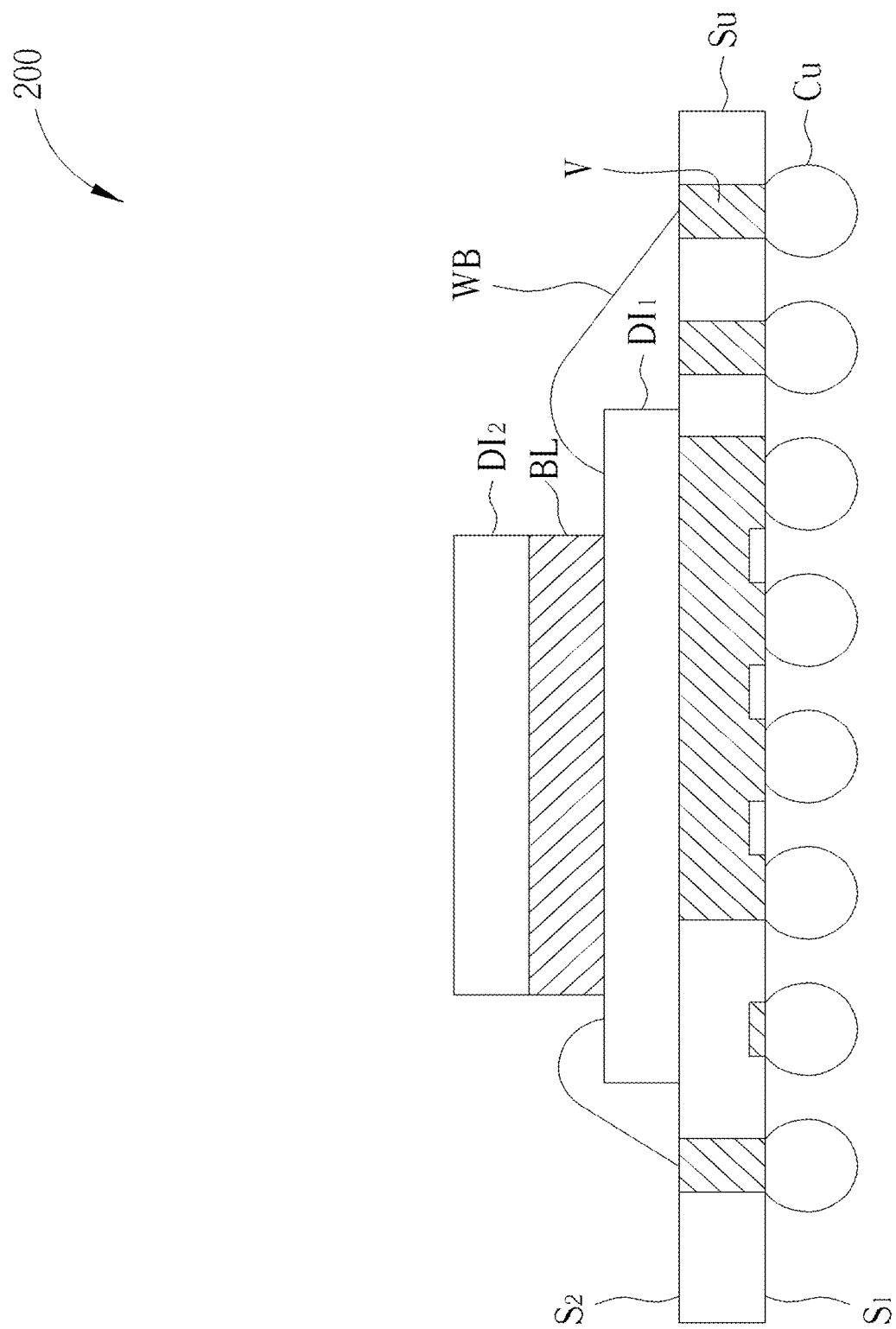
FIG. 2 is a cross sectional diagram illustrating a package structure according to one embodiment of the present application.

FIG. 2 is a cross sectional diagram illustrating a package structure 200 according to one embodiment of the present application.

As shown in FIG. 2, the package structure 200 comprises a substrate Su, a first die $DI_1$, a connecting layer BL, a second die $DI_2$ and at least one bonding wire WB. The substrate Su having at least one conductive unit Cu (only one of them is marked by a symbol) provided on a first surface $S_1$ thereof. The first die $DI_1$ is provided on a second surface $S_2$ of the substrate Su. The connecting layer BL is provided on the first die $DI_1$, and is for electrically bumping the first die $DI_1$ to the second die $DI_2$. In one embodiment, the connecting layer BL comprises at least one bump for electrically connecting the first die $DI_1$ to the second die $DI_2$. The at least one bonding wire WB is for connecting the first die $DI_1$ and the conductive units Cu, or connecting the first die $DI_1$ and the substrate Su. In one embodiment, the bonding wire WB is connected to via V formed in the substrate Su, which is electrically connected to the conductive unit Cu, but is not limited. Also, in the embodiment illustrated in FIG. 2, the size of the first die $DI_1$ is larger than which of the second die $DI_2$.

Figure 3:
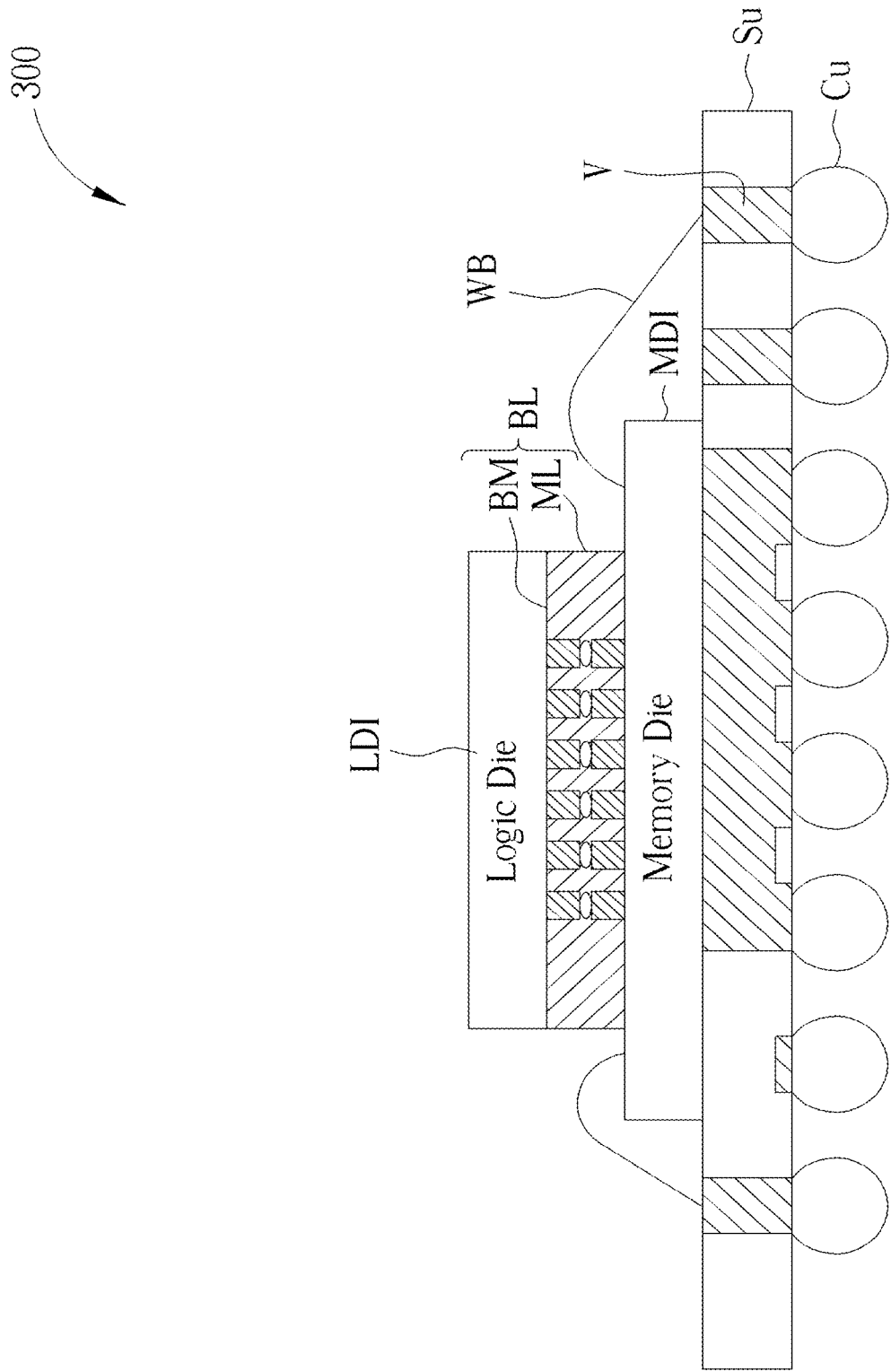
FIG. 3 is a cross sectional diagram illustrating detail structures for the embodiment shown in FIG. 2 of the present application.

FIG. 3 is a cross sectional diagram illustrating detail structures for the embodiment shown in FIG. 2 of the present application. As shown in FIG. 3, the first die of the package structure 300 is a memory die MDI and the second die is a logic die LDI. Please note the kinds of dies can be swapped. That is, the first die can be a logic die LDI and the second die can be a memory die MDI. Additionally, in one embodiment the connecting layer BL is generated via a flip chip process. In another embodiment, the connecting layer BL comprises a metal layer ML located between the memory die MDI and the logic die LDI, and at least one micro bump BM for connecting the memory die MDI and the logic die LDI. Also, in such embodiment, the metal layer ML is a redistribution layer (RDL). Please note the package structure according to the present application can include only part of the structures described in FIG. 3. For example, the first die and the second die can be other kinds of dies besides the memory die and the logic die, but the connecting layer BL can still comprise a metal layer ML, and the micro bump BM.

FIG. 4-FIG. 8 are cross sectional diagrams illustrating a package structure according to different embodiments of the present application.

Figure 4:
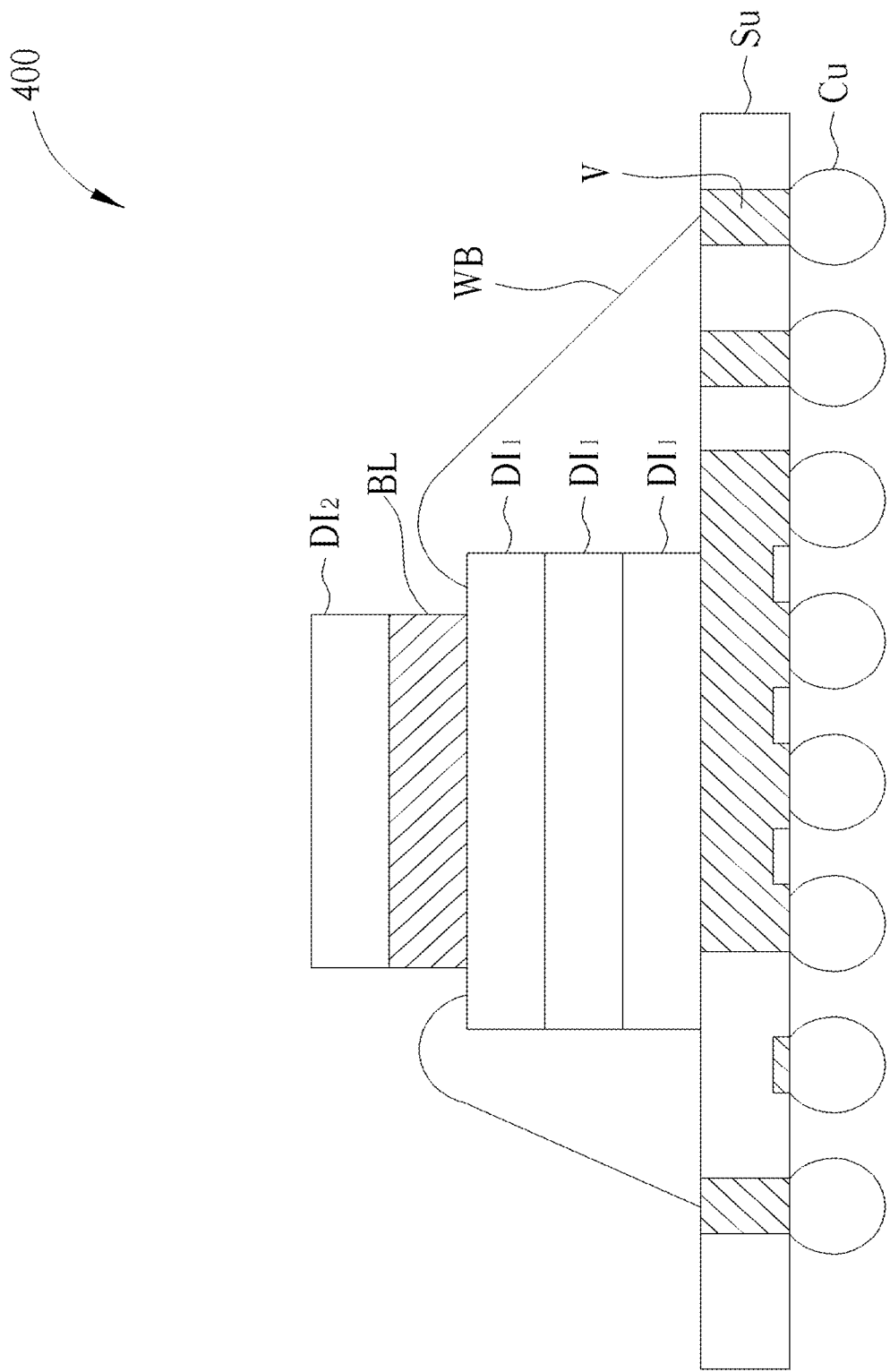
FIG. 4-FIG. 8 are cross sectional diagrams illustrating a package structure according to different embodiments of the present application.

In FIG. 4, the package structure 400 comprises more than one first die $DI_1$ located between the connecting layer BL and the substrate Su. If the package structure 400 is a wide I/O memory device, the first dies can be memory dies to form a memory cube.

Figure 5:
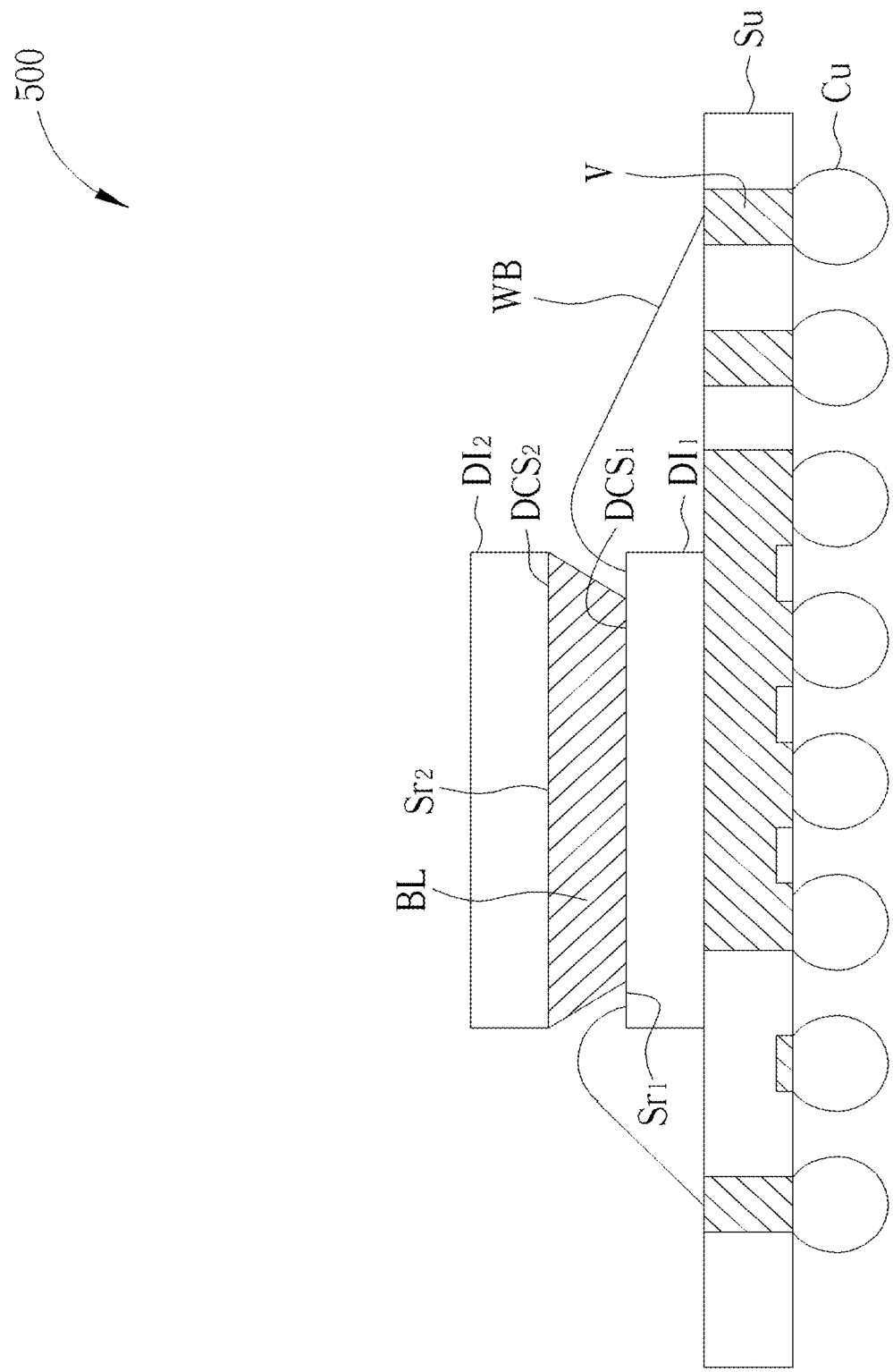

In the package structure 500 of FIG. 5, the sizes of the first die $DI_1$ and the second die $DI_2$ are the same, and the connecting layer BL has a first touch side $DCS_1$ and a second touch side $DCS_2$. The first touch side $DCS_1$ contacts a first surface $Sr_1$ of the first die $DI_1$ and the second touch side $DCS_2$ contacts a second surface $Sr_2$ of the second die $DI_2$. Also, in FIG. 5 an area of the first touch side $DCS_1$ is smaller than which for the first surface $Sr_1$ of the first die $DI_1$, and an area of the second touch side $DCS_2$ equals to which for the second surface $Sr_2$ of the second die $DI_2$.

Figure 6:
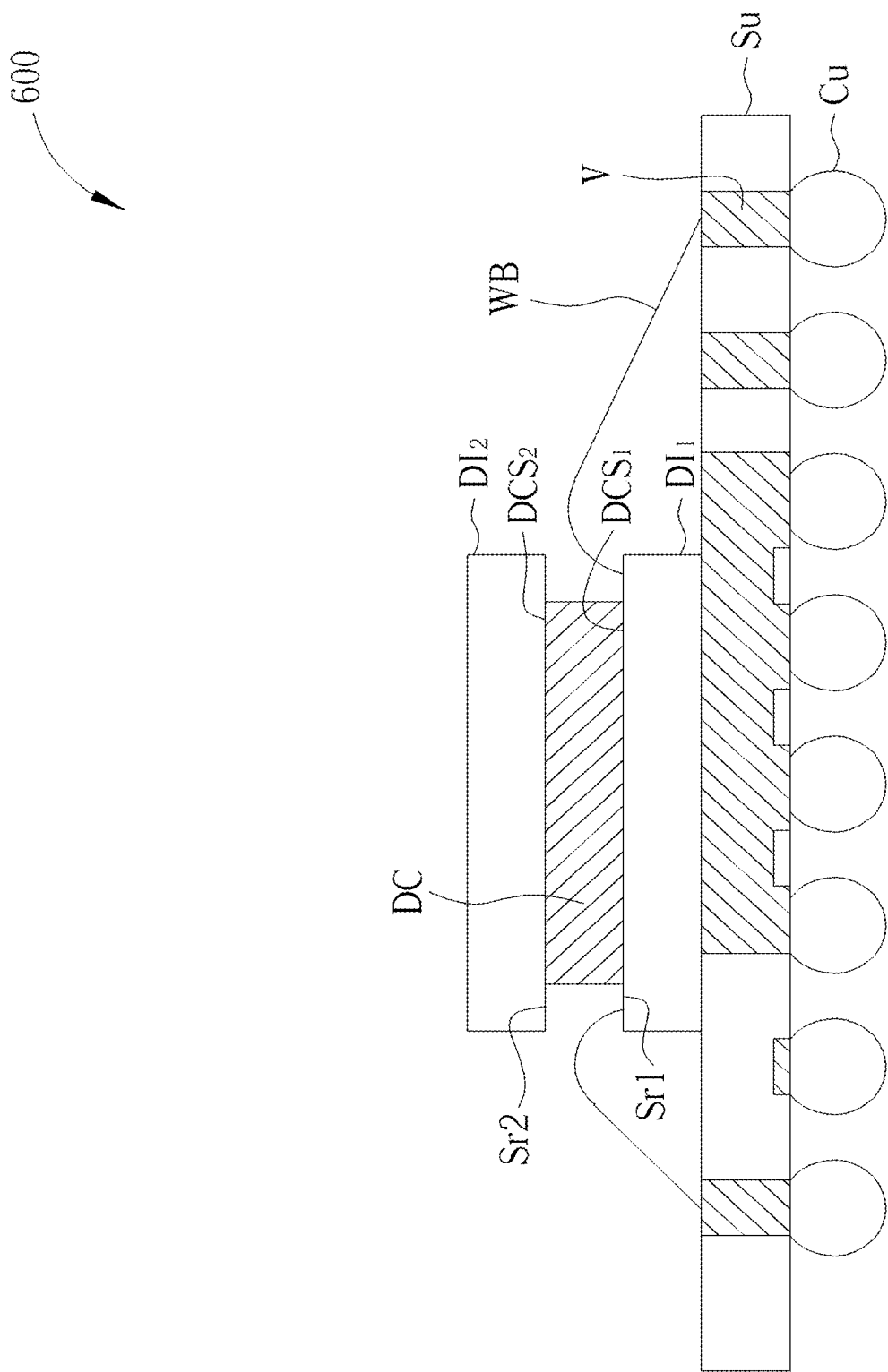

The structure shown in FIG. 6 is almost the same as which of FIG. 5, one difference is that the area of the second touch side $DCS_2$ equals to which for the second surface $Sr_2$ of the second die $DI_2$ for the package structure 500 in FIG. 5, but the area for the second touch side $DCS_2$ is smaller than which for the second surface $Sr_2$ of the second die $DI_2$ for the package structure 600 in FIG. 6.

Figure 7:
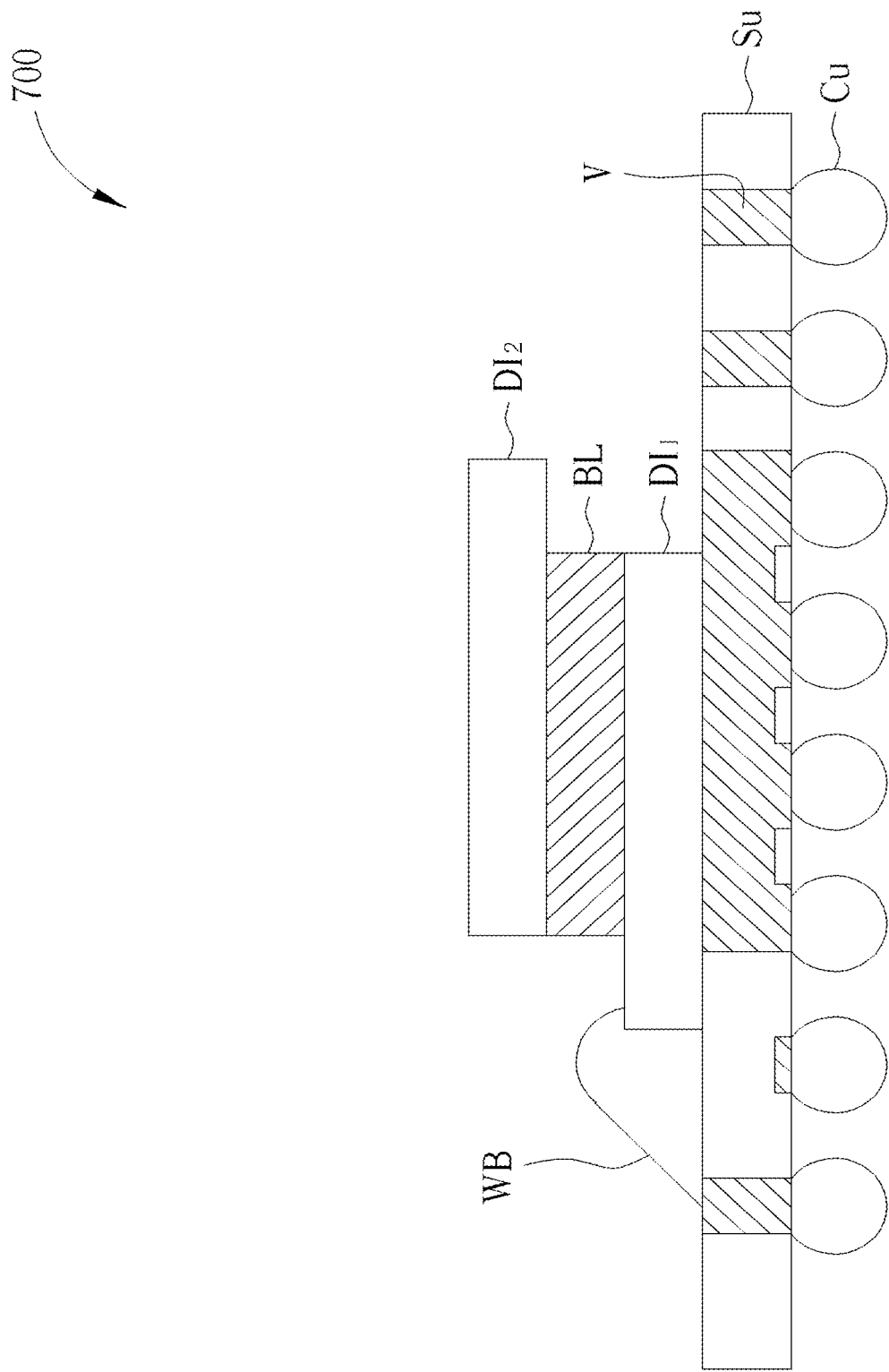
Figure 8:
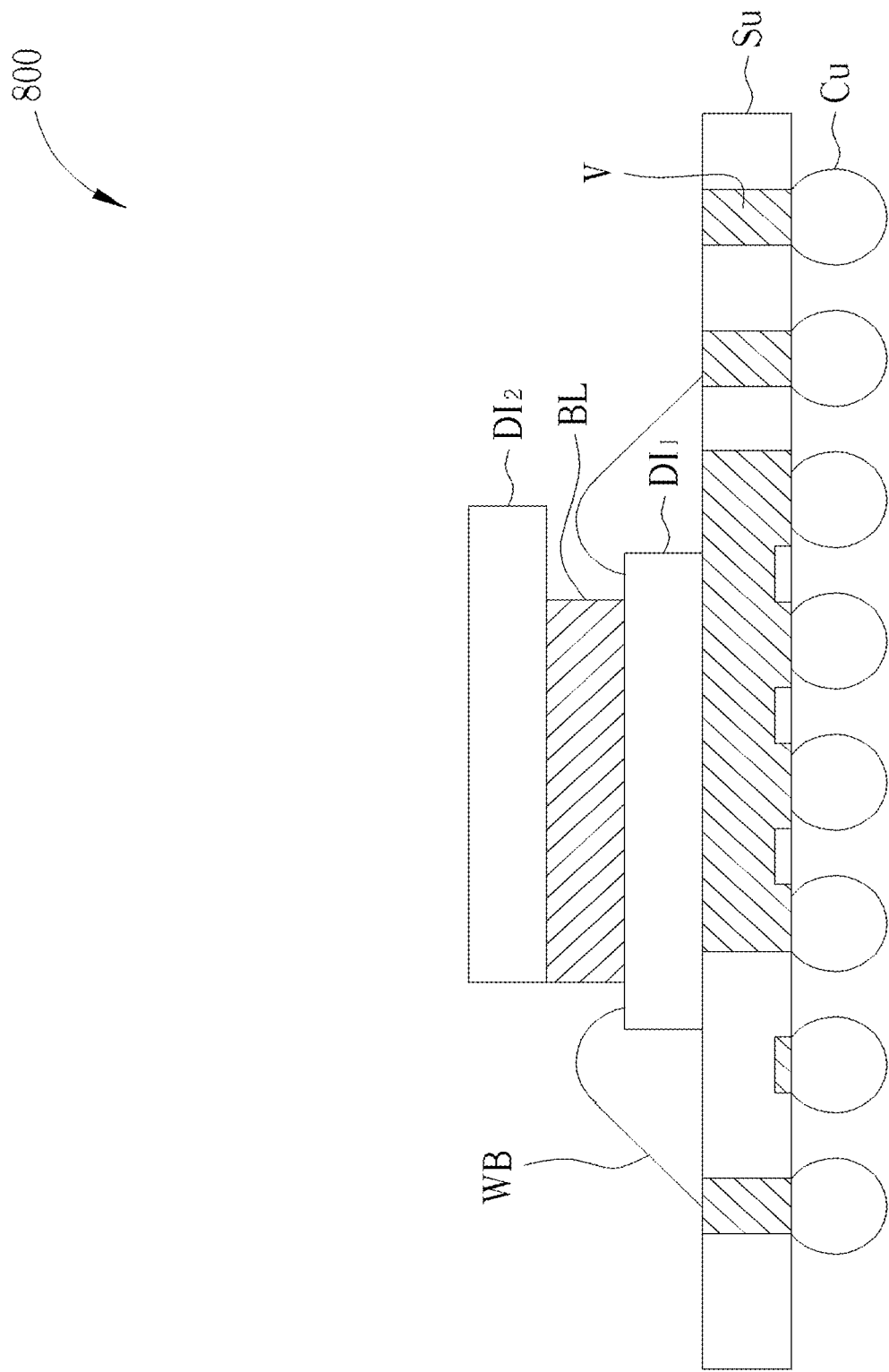

In the embodiments described in FIG. 7 and FIG. 8, the sizes of the first die $DI_1$ and the second die $DI_2$ are the same as well, but the location for the first die $DI_1$ or the second die $DI_2$ is shifted such that a projected image of the second die $DI_2$ does not totally contain the first die $DI_1$. In the embodiment described in FIG. 7, bonding wire WB is only provided to one side of the first die $DI_1$. In the embodiment described in FIG. 8, bonding wires WB are provided to two sides of the first die $DI_1$.

Please note the structure illustrated in FIG. 3 can also be applied the embodiments described in FIG. 4-FIG. 8.

In view of above-mentioned embodiments, a package structure can be produced without performing TSV processes. Therefore, the cost can be largely reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package structure, comprising:
a substrate, having at least one conductive unit provided at a first surface of the substrate;
at least one first die, provided over a second surface of the substrate;
a connecting layer, provided on the at least one first die;
a second die, provided directly on the connecting layer, wherein the connecting layer comprises at least one bump for connecting the at least one first die to the second die such that the at least one first die and the second die are electrically connected; and
at least one conductor, for electrically connecting the at least one first die to the at least one conductive unit or the substrate,
wherein the connecting layer has a first touch side and a second touch side, wherein the first touch side contacts a first surface of the at least one first die and the second touch side contacts a second surface of the second die,
wherein an area of the second touch side of the connecting layer is smaller than an area of the second surface of the second die, and wherein an area of the first touch side is smaller than an area of the first surface of the at least one first die, and
wherein at least one lateral boundary of the second surface of the second die is contained within a lateral extent of the first surface of the at least one first die, the at least one first die is disposed between the substrate and the second die, and
a size of the at least one first die is larger than that of the second die.

2. The package structure of claim 1, wherein the at least one first die is a memory die and the second die is a logic die.

3. The package structure of claim 1, wherein the at least one first die is a logic die and the second die is a memory die.

4. The package structure of claim 1, wherein a projected image of the second die does not totally contain the at least one first die.

5. The package structure of claim 1, wherein the at least one conductor is only provided at one side of the at least one first die.

6. The package structure of claim 5, wherein a location for the at least one first die or the second die is shifted.

7. The package structure of claim 1, wherein the connecting layer is generated via a flip chip process.

8. The package structure of claim 1, wherein the connecting layer comprises a metal layer located between the at least one first die and the second die, and at least one micro bump for connecting the at least one first die and the second die.

9. A package structure, comprising:
a substrate, having at least one conductive unit provided at a first surface of the substrate;
at least one first die, provided over a second surface of the substrate;
a connecting layer, provided on the at least one first die;
a second die, provided directly on the connecting layer, wherein the connecting layer comprises at least one bump for connecting the at least one first die to the second die such that the at least one first die and the second die are electrically connected; and
at least one conductor for electrically connecting the at least one first die to the at least one conductive unit or the substrate,
wherein the connecting layer has a first touch side and a second touch side, wherein the first touch side contacts a first surface of the at least one first die and the second touch side contacts a second surface of the second die, wherein a size of the second touch side of the connecting layer is smaller than a size of the first surface of the at least one first die,
wherein the connecting layer comprises a metal layer located between the at least one first die and the second die, and at least one micro bump for connecting the at least one first die and the second die, and
wherein the at least one first die is disposed between the substrate and the second die and
a size of the at least one first die is larger than that of the second die.

10. The package structure of claim 9, wherein the at least one first die is a memory die and the second die is a logic die.

11. The package structure of claim 9, wherein the at least one first die is a logic die and the second die is a memory die.

12. The package structure of claim 9, wherein a size of the at least one first die equals a size of the second die.

13. The package structure of claim 9, where an area of the second touch side equals an area of the second surface of the second die.

14. The package structure of claim 9, wherein a projected image of the second die does not totally contain the at least one first die.

15. The package structure of claim 9, wherein the at least one conductor is only provided at one side of the at least one first die.

16. A package structure, comprising:
- a substrate, having at least one conductive unit provided at a first surface of the substrate;
- at least one first die, provided over a second surface of the substrate;
- a connecting layer, provided on the at least one first die;
- a second die, provided directly on the connecting layer, wherein the connecting layer comprises at least one bump for connecting the at least one first die to the second die such that the at least one first die and the second die are electrically connected; and
- at least one conductor, for electrically connecting the at least one first die to the at least one conductive unit or the substrate,
- wherein the connecting layer has a first touch side and a second touch side, wherein the first touch side contacts a first surface of the at least one first die and the second touch side contacts a second surface of the second die,
- wherein an area of the second touch side of the connecting layer is smaller than an area of the second surface of the second die, and wherein an area of the first touch side is smaller than an area of the first surface of the at least one first die,
- a center location for the at least one first die is shifted from a center location for the second die along a direction parallel to the first surface, and wherein
- the at least one first die is disposed between the substrate and the second die,
- a size of the at least one first die is larger than that of the second die, and
- the at least one first die is a logic die and the second die is a memory die.

17. The package structure of claim 16, wherein the second die is part of a stack of a plurality of memory dies.

* * * * *